United States Patent
Henning et al.

(10) Patent No.: US 11,890,966 B2
(45) Date of Patent: Feb. 6, 2024

(54) CONTROL UNIT FOR AN ELECTRIC VEHICLE WITH AN ELECTROMECHANICAL BRAKE UNIT, VEHICLE THEREWITH AND METHOD OF USE

(71) Applicant: ZF CV Systems Europe BV, Brussels (BE)

(72) Inventors: Paul Henning, Schwetzingen (DE); Johannes Heseding, Hannover (DE); Gerd Schünemann, Laatzen (DE); Christoph Moritz, Hannover (DE)

(73) Assignee: ZF CV Systems Europe BV, Brussels (BE)

( * ) Notice: Subject to any disclaimer, the term of this patent is extended or adjusted under 35 U.S.C. 154(b) by 346 days.

(21) Appl. No.: 17/435,430

(22) PCT Filed: Mar. 4, 2020

(86) PCT No.: PCT/EP2020/055662
§ 371 (c)(1),
(2) Date: Sep. 1, 2021

(87) PCT Pub. No.: WO2020/193091
PCT Pub. Date: Oct. 1, 2020

(65) Prior Publication Data
US 2022/0314811 A1    Oct. 6, 2022

(30) Foreign Application Priority Data
Mar. 26, 2019  (DE) ............... 10 2019 107 741.9

(51) Int. Cl.
*B60L 50/60*    (2019.01)
*B60L 7/24*    (2006.01)
(Continued)

(52) U.S. Cl.
CPC ............. *B60L 7/24* (2013.01); *B60L 15/2009* (2013.01); *B60L 50/60* (2019.02);
(Continued)

(58) Field of Classification Search
CPC ........ B60L 7/24; B60L 50/60; B60L 15/2009; B60L 2200/18; B60L 2200/28;
(Continued)

(56) References Cited

FOREIGN PATENT DOCUMENTS

| CN | 105459830 A | 4/2016 |
|---|---|---|
| DE | 102004057100 A1 | 6/2006 |

(Continued)

OTHER PUBLICATIONS

European Patent Office, Rijswijk, Netherlands, International Search Report of International Application No. PCT/EP2020/055662, dated Jun. 22, 2020, 2 pages.

*Primary Examiner* — Mathew Franklin Gordon
(74) *Attorney, Agent, or Firm* — Dickinson Wright PLLC (57) ABSTRACT

A control unit (56) for a vehicle (10) with an electric drive (12) and an electromechanically actuated brake unit (14) includes a high-voltage DC link (20) disconnectably connected to a first energy store (24) of the electric drive (12), a converter (18) connected to the high-voltage DC link (20) and operable bidirectionally, and an electric motor (16) connected to the converter (18) for driving a wheel (50) of the vehicle (10). A brake drive circuit (36) is connected to the high-voltage DC link (20), and another electric motor (34), is connected to the brake drive circuit (36). A function block (55) has an input (69) for receiving a voltage signal (68) indicative of the voltage of the high-voltage DC link (20), a first output (63) for outputting a converter drive signal (60), and a first closed-loop controller unit (66) for generating the converter drive signal (60).

14 Claims, 4 Drawing Sheets

(51) Int. Cl.
*B60L 15/20* (2006.01)
*G01R 19/165* (2006.01)

(52) U.S. Cl.
CPC .... *G01R 19/16576* (2013.01); *B60L 2200/18* (2013.01); *B60L 2200/28* (2013.01); *B60L 2210/10* (2013.01); *B60L 2240/423* (2013.01); *B60L 2240/527* (2013.01)

(58) Field of Classification Search
CPC .......... B60L 2210/10; B60L 2240/423; B60L 2240/527; G01R 19/1657
See application file for complete search history.

(56) References Cited

FOREIGN PATENT DOCUMENTS

| | | |
|---|---|---|
| DE | 102004063788 A1 | 7/2006 |
| DE | 102012216089 A1 | 3/2014 |

CONTROL UNIT FOR AN ELECTRIC VEHICLE WITH AN ELECTROMECHANICAL BRAKE UNIT, VEHICLE THEREWITH AND METHOD OF USE

TECHNICAL FIELD

The invention relates to the field of vehicles which are driven electrically or in hybrid fashion, in particular a control unit for an electric vehicle with an electromechanical brake unit, vehicle therewith and method of use.

BACKGROUND

Such vehicles comprise utility vehicles, such as heavy goods vehicles, passenger cars or trailers. Electrically driven vehicles, even in the field of utility vehicles, are already known. Such vehicles are often vehicles having an internal combustion engine which have been further developed to form hybrid vehicles, wherein utility vehicles are also known in which the internal combustion engine, when the vehicle has been developed, has substantially been replaced by an electric drive.

Furthermore, the invention also relates to the field of vehicles which also have electromechanically actuated brakes in addition to the electric drive. Until now, predominantly pneumatically actuated friction brakes have been used in utility vehicles, in which a pneumatic cylinder, under the action of compressed air, extends in order to implement a driver's desire to brake and thus presses, by means of a lever, brake linings onto brake disks which are fixedly connected to the wheel axle. On the other hand, an electromechanically actuated brake is formed with an actuator in the form of an electric motor for converting electrical energy into mechanical energy. A mechanical gear mechanism for converting the rotary movement or linear movement of the motor into a translatory movement is provided here. The translatory movement actuates a brake lever of the otherwise substantially unchanged originally pneumatically actuated friction brake.

Such vehicles have an energy store, which firstly serves the purpose of supplying energy to the electric motor of the electric drive for driving the vehicle and into which energy can even be fed when the electric motor of the electric drive is being operated in a generator operating mode for providing a braking function. This energy store at the same time serves the purpose of providing electrical energy for the actuation of the friction brakes with the electromechanically actuated brakes.

In accordance with national and international regulations, it is necessary to ensure that a braking power of the electromechanically actuated brakes which is required for a vehicle deceleration which needs to be adhered to is even available when it has been necessary for the energy store to be disconnected due to a malfunction. In order to meet the regulations, the energy store can be formed from at least two energy store modules, which are each disconnectably connected to a DC link and each provide a component storage capacity of the predefined total storage capacity. In the event of a fault in one of the energy store modules, this module can be disconnected separately so that the full system functionality of the electromechanically actuated brakes can continue to be maintained with the energy of the energy store module which has not been disconnected. For this solution, however, an increased level of system complexity of the energy store and the costs for the at least doubled number of all-pole disconnecting devices for the at least two energy store modules need to be taken into account.

SUMMARY

The object of the present invention therefore consists in continuing to provide, even in the event of a fault in an energy store of an electric drive for a vehicle, a required actuation power of electromechanically actuated brakes of the vehicle. This is intended to be achieved by as little an increase as possible in the system complexity of the energy store and maximum avoidance of additional hardware components.

Accordingly, a control unit for a vehicle having an electric drive and an electromechanically actuated brake unit is proposed. The vehicle is in particular a utility vehicle which is, for example, a tractor or a trailer. In this case, the control unit is adapted for a vehicle with an electric drive which has a high-voltage DC link. The high-voltage DC link is disconnectably connectable to an energy store. For this purpose, for example, a switch disconnector is provided, which produces an all-pole connection between the high-voltage DC link and the energy store and, in the event of a fault, interrupts the connection at all poles.

In addition, the electric drive comprises at least one converter, which is connected to the high-voltage DC link and is operable bidirectionally. Bidirectional means that the converter, corresponding to actuation, feeds energy into the high-voltage DC link or draws energy from the high-voltage DC link. The converter preferably comprises the function of an inverter, which converts DC voltage or direct current into polyphase AC voltage or polyphase alternating current, and particularly preferably of an active rectifier, which additionally converts polyphase AC voltage or polyphase alternating current into DC voltage or direct current.

Furthermore, the electric drive comprises at least one electric motor, which is connected to the converter, for driving at least one wheel of the vehicle, wherein the motor is also operable in the generator mode. A generator operating mode refers in particular to an operating mode in which a braking torque is generated at the wheel connected to the electric motor and, by virtue of the rotation of the wheel, electrical energy is generated by the motor from the kinetic energy of the wheel. The motor is preferably a three-phase motor.

The electromechanically actuated brake unit comprises an electric motor in order to actuate a brake of the vehicle. Preferably, the electric motor of the brake unit is connected to a friction brake and designed to exert a force on a brake lining in order to press the brake lining against a brake disk of the friction brake. In addition, the electromechanically actuated brake unit comprises a brake drive circuit, which is connected to the high-voltage DC link and the at least one electric motor in order to operate the electric motor, depending on a brake request signal, with energy from the high-voltage DC link. The brake request signal can be considered to be a converter drive signal when the brake drive circuit is preferably in the form of a converter. In order to distinguish in terms of terminology from the components of the electric drive, however, based on the brake unit, the terms "brake request signal" and "brake drive circuit" will be used below.

The control unit according to the invention has a function block. The function block comprises an input for receiving a voltage signal which is indicative of the voltage of the high-voltage DC link. In addition, the function block comprises a first output for outputting a converter drive signal for driving the converter. The driving here refers to the driving of the converter such that the motor is supplied energy from the high-voltage DC link which is such that it generates a torque which is predefined by the converter drive signal. The driving also relates to driving such that the electrical energy generated in the motor in the generator operating mode is converted via the converter and fed into the high-voltage DC link. Furthermore, the function block of the control unit comprises a first closed-loop control unit, in particular a PI controller, for generating the converter drive signal depending on the received voltage signal and a predefined comparison value, in particular a setpoint voltage value.

Accordingly, the control unit is designed for a vehicle which comprises an electric drive and an electromechanically actuated brake unit, wherein the electric motor(s) of the drive unit and the electric motor(s) of the brake unit are each supplied energy for operating the electric motors from a high-voltage DC link. The control unit comprises, for this, a function block, which can monitor, according to the invention, the voltage of the high-voltage DC link by virtue of receiving a voltage signal which indicates this voltage. Depending on a comparison value and the voltage signal, the converter is then driven by a converter drive signal which is generated by a first closed-loop controller unit.

In comparison with driving of the converter depending on a desired acceleration or deceleration using a torque request signal by virtue of an input by a driver in the form of, for example, an actuation of a gas pedal or a brake pedal, here the converter is actuated depending on the voltage of the high-voltage DC link. It is thus possible, when an energy store which keeps the high-voltage DC link to a preset voltage fails, that this voltage can be maintained with the aid of the closed-loop controller unit and the converter, i.e. preferably the voltage of the high-voltage DC link is kept substantially constant. The comparison value which is preset as setpoint voltage value preferably corresponds substantially to the setpoint voltage of the energy store or the minimum voltage of the energy store, which is also referred to as minimal voltage. A typical traction battery has, for example, nominally a voltage of 661 V. Depending on the state of charge, the voltage can, however, fluctuate within the range of from a minimal voltage of 540 V to a maximum voltage of 756 V. In the event of failure of a battery, it is sufficient that the minimum voltage is maintained via the converter.

If, accordingly, in the event of a disconnected energy store from the high-voltage DC link, for example an electromechanically actuated brake unit is triggered or operated owing to a requested deceleration, i.e. if energy is drawn from the high-voltage DC link by the electric motor of the electromechanically actuated brake unit, this is detected by the voltage signal and the converter is driven such that an attempt is made to substantially maintain the voltage of the high-voltage DC link. For this purpose, the converter is preferably driven in such a way that the motor of the electric drive is operated in a generator operating mode and therefore energy is fed via the electric motor of the electric drive and the converter into the high-voltage DC link which precisely corresponds to the amount of energy which has been drawn by the actuation of the electric motor of the electromechanically actuated brake unit. The motor is operated in the generator operating mode until the voltage of the high-voltage DC link constantly corresponds to a setpoint voltage of the high-voltage DC link. This predefined setpoint voltage of the high-voltage DC link preferably corresponds to the comparison value. At least the comparison value is derived from the value for the setpoint voltage of the high-voltage DC link.

In the event of a failure of all of the energy stores connected directly to the high-voltage DC link, therefore, an electromechanically actuated brake unit can continue to be operated, in particular without a redundant energy store needing to be provided for supplying power to the high-voltage DC link.

In accordance with a first embodiment, the function block also has a second output, which is designed to output a DC-DC converter drive signal for driving a DC-DC converter. A DC-DC converter is connected in a vehicle with an electric drive between the high-voltage DC link and a low-voltage DC link. The low-voltage DC link is preferably a circuit which is connected to a conventional vehicle battery for providing the on-board voltage, in particular 12 volts, 24 volts or 48 volts, and is connected to the consumer, such as, for example, the lighting, comfort functions etc.

By virtue of the DC-DC converter drive signal, thus, in addition to an energy fed in via the electric motor of the electric drive, a DC-DC converter drive signal can be output into the high-voltage DC link in particular driving situations in order to supply energy, for example, to the high-voltage DC link additionally from the low-voltage DC link.

In accordance with this first embodiment, the function block has, for this purpose, a second closed-loop controller unit, which generates the DC-DC converter drive signal depending on the voltage signal and the comparison value and preferably at least one further comparison value, such as a predefined threshold value. Instead of or in addition to a predefined threshold value, in accordance with further special embodiments, yet further signals may be considered as further comparison value in order to generate the DC-DC converter drive signal, which, for example, specify a present driving situation. A present driving situation is, for example, the present speed, the loading and/or whether the present travel is an uphill or downhill travel.

This configuration takes into consideration the fact that, in the event that the electric drive cannot provide sufficient energy in the generator operating mode by driving with the control unit in specific driving situations in order to keep the high-voltage DC link at a sufficient voltage, additionally energy is drawn from the low-voltage DC link. Such events occur, for example, when the vehicle is moving forwards only very slowly still. In this case, additional energy is then provided for the high-voltage DC link in accordance with the invention by corresponding driving of the DC-DC converter by the DC-DC converter drive signal from the low-voltage DC link.

The invention takes into consideration the fact that a conventionally used DC-DC converter which, as a connection between the high-voltage DC link and the low-voltage DC link of the vehicle, is not suitable alone for maintaining a high-voltage DC link voltage in the event of failure of an energy store connected to the high-voltage DC link with energy from the low-voltage DC link, can nevertheless be used, in certain driving situations, for maintaining the voltage in the high-voltage DC link, i.e. can at least make a contribution.

In accordance with a further embodiment, the control unit comprises a voltmeter for measuring the voltage of the high-voltage DC link. The voltmeter is used for providing the voltage signal for the function block.

A direct measurement of the voltage of the high-voltage DC link by a voltmeter is advantageous for providing the voltage signal for the function block directly so that a drive signal for the converter can be generated as quickly as possible. Time delays between the withdrawal of energy from the high-voltage DC link, the detection of this withdrawal and the supply of energy by driving of the converter are therefore minimized. A dip in the voltage in the high-voltage DC link is therefore counteracted further.

In accordance with a further embodiment, the control unit comprises a changeover switch for switching over between a normal operating mode and an emergency operating mode. In this case, the changeover switch is designed to generate the converter drive signal in the emergency operating mode depending on the received voltage signal and the comparison value and in the normal operating mode depending on a torque request signal, which is received at a second input of the control unit, for the electric drive. As a result, it is ensured that the driving of the converter of the electric drive by the control unit only takes place in the emergency operating mode, while in the normal operating mode the converter and therefore the electric motor of the electric drive are driven depending on a required torque alone.

The required torque, which is received from the control unit in the form of the torque request signal, in this case comprises a positive or negative torque value which is generated in particular depending on the driver's desire to accelerate or brake by actuation of the brake or gas pedal. If, for example, the driver actuates the gas pedal, the driver's desire to accelerate is expressed hereby and a torque request signal with a positive torque value is generated. By actuation of the converter, a thrust is then generated by the electric motor of the electric drive depending on this torque value. The same applies for a desire to brake, which is expressed by the driver by actuation of the brake pedal and generates a torque request signal with a negative torque value. This is then transmitted via the control unit to the converter in order to operate the electric motor of the electric drive in the generator operating mode and therefore to generate a corresponding negative torque. Particularly preferably, the torque values are not generated directly by actuation of the gas or brake pedal in the form of the torque request signal, but the pedal actuations are checked and corrected, if appropriate, by driver assist systems, wherein the correction is then reflected in the torque request signal.

Furthermore, the invention relates to a system for a vehicle, in particular a utility vehicle. The system comprises a control unit in accordance with one of the abovementioned embodiments and an electric drive. The electric drive comprises a high-voltage DC link, which is disconnectably connectable to at least one energy store. In addition, the electric drive comprises at least one converter, which is connected to the high-voltage DC link and is operable bidirectionally. Furthermore, the electric drive comprises at least one electric motor, which is connected to the converter and is operable in the generator mode.

In accordance with a further embodiment, the system comprises at least one electromechanically actuated brake unit, which is connected to the high-voltage DC link. The electromechanically actuated brake unit in this case comprises at least one electric motor for exerting a force on brakes, in particular friction brakes, of the vehicle. In addition, the electromechanically actuated brake unit comprises a brake drive circuit in order to operate the electric motor using energy from the high-voltage DC link depending on a brake request signal.

In accordance with a further embodiment, the system comprises at least one first energy store, in particular a rechargeable battery, and at least one second energy store, in particular a rechargeable battery. The first energy store in this case has a rated voltage which corresponds at least to a multiple of the rated voltage of the second energy store. The first energy store is disconnectably connected to the high-voltage DC link, and the second energy store is connected to the low-voltage DC link or is part of the low-voltage DC link.

In accordance with a further embodiment, the converter of the electric drive is a four-quadrant converter. By virtue of the formation of the converter as a four-quadrant converter, i.e. preferably in the form of an H-bridge circuit having four semiconductor switches, a DC voltage of the high-voltage DC link having a variable frequency and pulse width can be generated for operating the electric motor of the electric drive. At the same time, by actuation of the four-quadrant converter, energy generated by the electric motor in the generator operating mode can be generated into a DC voltage for being fed into the high-voltage DC link.

Furthermore, the invention comprises a vehicle, in particular a utility vehicle, having a control unit in accordance with one of the abovementioned embodiments or a system in accordance with one of the abovementioned embodiments. The vehicle is, for example, a tractor or a trailer.

Furthermore, the invention relates to a method for a vehicle, in particular in accordance with the abovementioned embodiment. In accordance with the method, the voltage of a high-voltage DC link of an electric drive is measured, and a converter drive signal for the electric drive is generated depending on the measured voltage and depending on a predefined comparison value by a first closed-loop controller unit, in particular comprising a PI controller or a plurality of interdependent control loops with different embodiments. The converter drive signal is in this case preferably generated in such a way that a voltage of the high-voltage DC link is kept substantially constant, to be precise to a setpoint voltage value preset by the predefined comparison value. In particular, in the event of a voltage drop across a high-voltage DC link, a converter drive signal is generated in order to operate the electric drive in the generator operating mode until the voltage of the high-voltage DC link corresponds to the or substantially a setpoint voltage value which is preset by the predefined comparison value. The comparison value which is preset as setpoint voltage value preferably substantially corresponds to the setpoint voltage or a minimal voltage of the first energy store.

The voltage of a high-voltage DC link can therefore also be maintained in the event of a failure of an energy store which is connected to the high-voltage DC link.

In accordance with one embodiment, the generation comprises the supply of the voltage signal, which is indicative of the measured voltage of the high-voltage DC link, as actual value to a first closed-loop controller unit. Furthermore, the generation comprises the supply of the predefined comparison value as setpoint value to the first closed-loop controller unit. In addition, the generation comprises the output of a manipulated variable of the first closed-loop controller unit as converter drive signal.

In accordance with a further embodiment, the method further comprises the generation of a DC-DC converter drive signal. In this case, the voltage signal comprising the measured voltage of the high-voltage DC link is passed as actual value to a second closed-loop controller unit. Furthermore, at least one predefined comparison value is passed to the second closed-loop controller unit. A manipulated variable of the second closed-loop controller unit is then output and is supplied as DC-DC converter drive signal for driving a DC-DC converter, which is connected to the high-voltage DC link and the low-voltage DC link, to the DC-DC converter.

In accordance with a further embodiment, the generation of a DC-DC converter drive signal comprises the comparison of the voltage signal with a threshold value or the comparison of a change over time in the voltage signal, in particular a gradient of the change over time in the voltage signal, with a change threshold value. The DC-DC converter drive signal is output only in the event that the voltage signal is below the threshold value or a change in the voltage signal is above a change threshold value. As a result, it is ensured that energy is only withdrawn from the low-voltage DC link by the DC-DC converter and supplied to the high-voltage DC link when a voltage change can no longer be maintained by the generator operating mode of the electric motor of the electric drive alone, and this is indicated by a falling or rapidly falling voltage value in the high-voltage DC link.

In accordance with a further embodiment, the converter drive signal is converted into a setpoint current variable by a further function block of the control unit or a controller which is superordinate to the control unit depending on a present speed of the at least one motor, the setpoint current variable is converted into a setpoint voltage depending on a current generated or taken up by the motor, and the setpoint voltage is converted into a pulse-width-modulated signal for driving the converter. A simple embodiment for driving the converter from the converter drive signal is therefore provided.

In addition, the invention relates to a computer program product, which comprises program code which, when run on a computer unit, in particular a control unit in accordance with one of the abovementioned embodiments, implements the method in accordance with one of the abovementioned embodiments, in particular in the form of a function block of the control unit.

Further embodiments can be gleaned from the exemplary embodiments explained in more detail in the drawings.

DETAILED DESCRIPTION OF THE DRAWINGS

Figure 1:
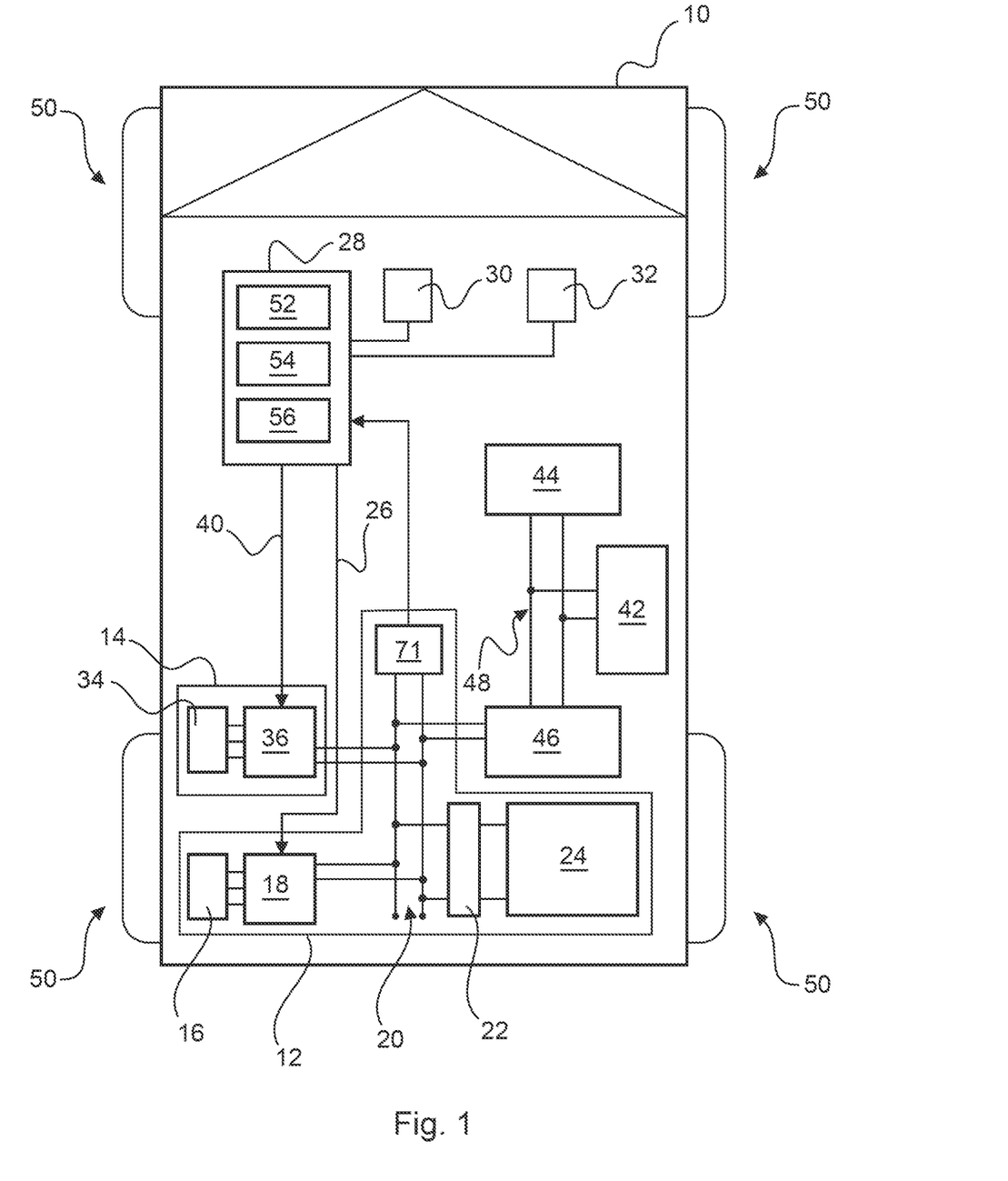
FIG. 1 shows a vehicle having an electric drive and an electromechanically actuated brake unit.

FIG. 1 shows a vehicle 10 having an electric drive 12 and an electromechanically actuated brake unit 14. The electric drive 12 comprises an electric motor 16, which is connected, via a converter 18, to a high-voltage DC link 20. The high-voltage DC link 20 is further electrically connected to a first energy store 24 via a switch disconnector 22. A substantially constant voltage for operating the electric motor 16 of the electric drive 12 is provided from the energy store 24 via the high-voltage DC link 20. Energy which is generated in the generator operating mode of the motor 16 can also be fed into the energy store 24 via the converter 18. The converter 18 of the electric drive 12 is driven depending on an electronic signal 26, which has been generated in a controller 28 from a converter drive signal. The electronic signal 26 is, for example, a pulse-width-modulated signal, a data signal (for example CAN) or an analog drive signal. The converter drive signal is likewise generated by the controller 28. In this case, in the normal operating mode of the vehicle 10, the converter drive signal and the electronic signal 26 resulting therefrom is generated by the controller 28 depending on a driver's desire to accelerate or brake. In order to communicate the driver's desire to the controller 28, in particular a brake pedal 30 and a gas pedal 32 are made available to the driver. A signal for accelerating or decelerating the vehicle can moreover, in accordance with a further exemplary embodiment not illustrated here, also originate from a driver assist system or a system for automated driving.

In the event of a desire to brake being expressed via the brake pedal 30, in addition the electromechanically actuated brake unit 14 is drivable via the controller 28 in order to provide additional braking power when the electric motor 16 of the electric drive 12 cannot provide this braking power in the generator operating mode. For this purpose, the electromechanically actuated brake unit 14 likewise has an electric motor 34, which is likewise connected to the high-voltage DC link 20 via a brake drive circuit 36, which is preferably likewise in the form of a converter. The brake drive circuit 36 is driven by the controller 28 by a brake request signal 40 when the brake unit 14 is required.

Correspondingly, energy is therefore supplied to the electric motor 16 of the electric drive 12 from the high-voltage DC link 20 via the converter 18 of the electric drive 12 depending on the signal 26 or, in the generator operating mode of the electric motor 16 of the electric drive 12, energy is fed into the high-voltage DC link 20 via the converter 18 of the electric drive 12. Likewise, the electric motor 34 of the electromechanically actuated brake unit 14 draws the energy for actuating friction brakes likewise from the high-voltage DC link 20.

Furthermore, the vehicle 10 comprises a vehicle battery 42, which serves the purpose of supplying energy to consumers 44 of the vehicle 10 which do not belong to the electric drive 12 or to the electromechanically actuated brake unit 14. Examples of such consumers 44 are the lighting of the vehicle 10 or the controller 28 itself. The vehicle battery 42 is connected to the high-voltage DC link 20 via a DC-DC converter 46. The vehicle battery 42 at the same time represents a low-voltage DC link 48.

In FIG. 1, the electric drive 12 and the electromechanically actuated brake unit 14 are only illustrated for one wheel 50 of the vehicle 10. This illustration is used for ease of understanding. Particularly preferably, an electromechanically actuated brake unit 14 is provided for each wheel 50, wherein the electric drive 12 can also have a plurality of electric motors 16, in each case for a plurality of wheels 50 of the vehicle 10 or in each case for driving an axle of the vehicle 10. Preferably, in the event that the electric drive 12 has a plurality of motors 16, each motor 16 has a converter 18, which is connected to the high-voltage DC link 20.

The controller 28 is illustrated by way of example in this figure and comprises a plurality of units, namely in particular a vehicle control device 52, a brake control device 54 and the control unit 56 according to the invention. The control unit 56 according to the invention is illustrated here as a separate unit but, in accordance with other exemplary embodiments, is also part of the vehicle control device 52 or the brake control device 54 or corresponds to the vehicle control device 52 or the brake control device 54. For improved clarity, the three mentioned units are combined here as controller 28.

Figure 2:
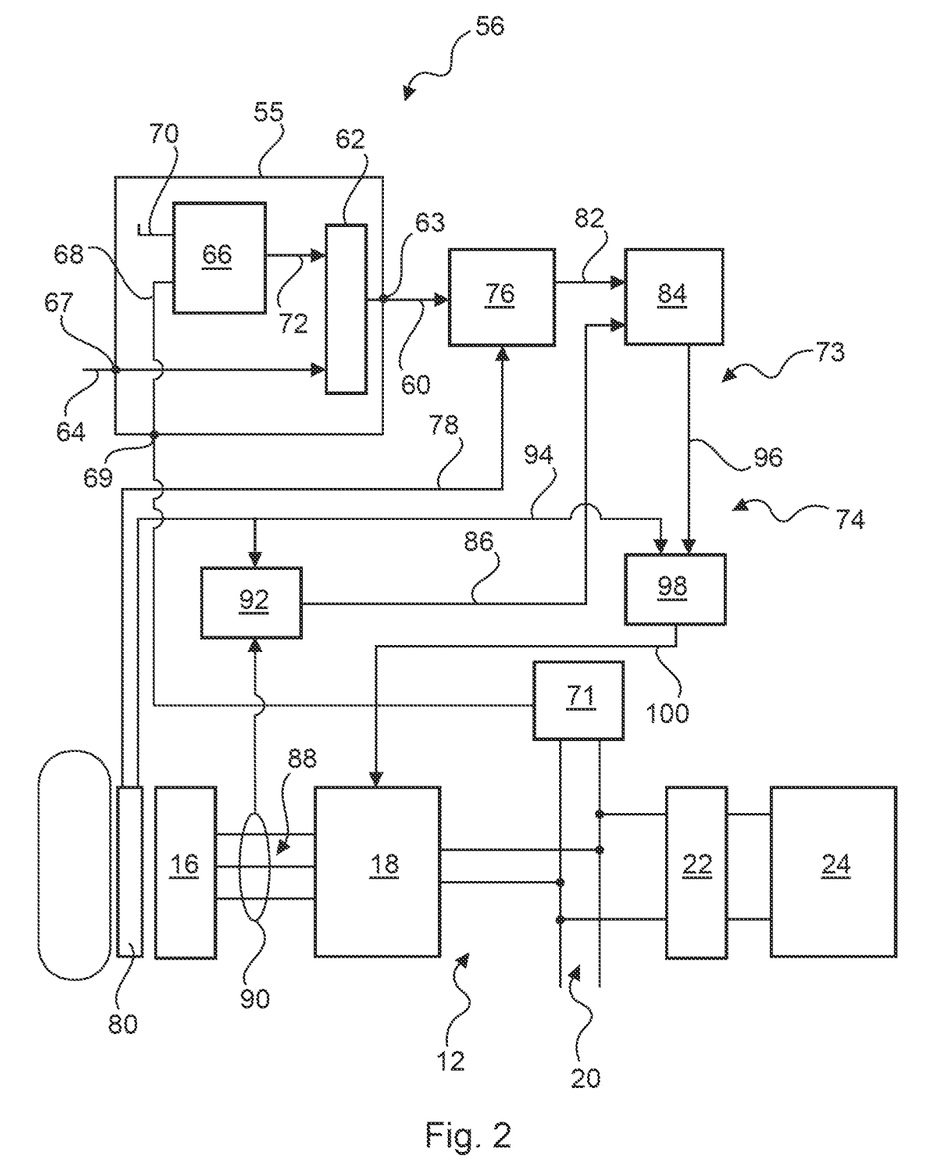
FIG. 2 shows the design of the driving of an electric drive in accordance with one exemplary embodiment.

FIG. 2 shows a more detailed illustration of part of the controller 28 from FIG. 1 and the design for driving the electric drive 12 in accordance with one exemplary embodiment. In particular, FIG. 2 shows a function block 55 of a control unit 56 in accordance with one exemplary embodiment of the invention for generating a converter drive signal 60. The converter drive signal 60 is output by a changeover switch 62 of the control unit 56 at a first output 63 of the control unit 56. The changeover switch 62 is used for switching over between a normal operating mode and an emergency operating mode. If the first energy store 24 is disconnected from the high-voltage DC link 20, the changeover switch 62 switches to the emergency operating mode. In this case, the converter drive signal 60 is generated by a first closed-loop controller 66 and is output at the first output 63 via the changeover switch 62. The converter drive signal 60 is generated by the closed-loop controller 66 by virtue of a voltage signal 68 of the present voltage of the high-voltage DC link 20 being supplied as actual value via a first input 69 to the first closed-loop controller 66. The voltage is measured by means of a voltmeter 71. In addition, a comparison value 70 is preset as setpoint value for the first closed-loop controller 66. The first closed-loop controller 66 generates herefrom a manipulated variable 72, which corresponds to the converter drive signal 60 and is output via the changeover switch 62. In the normal operating mode, the converter drive signal 60 corresponds to a torque request signal 64 which is received from the control unit 56 and which is received via a second input 67 and passed through the changeover switch 62.

The converter drive signal 60 is not used directly for driving the converter 18 of the electric drive 12 but is now subjected to further signal processing in a further function block 73. This signal processing in accordance with the present example is not part of the control unit 56, but part of a further control unit 74 of the electric drive 12, which control unit 74 is likewise contained in the controller 28. This further control unit 74 is, however, also embodied as part of the control unit 56 according to the invention, in accordance with further exemplary embodiments (not illustrated here). The control unit 56 according to the invention together with the further control unit 74 of the electric drive 12 is part of the brake control device 54 in accordance with a further exemplary embodiment. In the further signal processing illustrated here as further control unit 74, the converter drive signal 60 is first supplied to a further closed-loop controller 76, to which a present speed 78 of the electric motor 16 is likewise supplied by a sensor 80 arranged at the electric motor 16.

The converter drive signal 60, which preferably corresponds to a torque value, is converted by the further closed-loop controller 76 into a drive current 82 depending on the speed 78. The further closed-loop controller 76 is necessary since the drive current 82 is dependent on the present speed 78 for a desired torque. In a further closed-loop controller 84, the drive current 82, which is supplied as setpoint value, is then compared with the aid of an actual current 86, which is likewise supplied to the closed-loop controller 84 and which is being taken up or output at that time by the electric motor 16. For this purpose, the actual current signal 86 is generated by virtue of, first, the current being measured over three phases 88, which are supplied to the electric motor 16, by an ammeter 90, and this current being converted into the actual current signal 86 via a Clarke transformer 92 taking into consideration an angle of rotation 94 determined likewise by the position sensor 80. From this, a DC voltage signal 96 is generated, which acts as manipulated variable for the converter 18. In a further unit 98, a DQ transformation is implemented, and the transformed signal is converted into an electronic signal 26 in the form of a pulse-width-modulated signal 100, likewise taking into consideration the angle of rotation 94. The pulse-width-modulated signal 100 is used for directly driving the converter 18.

Figure 3:
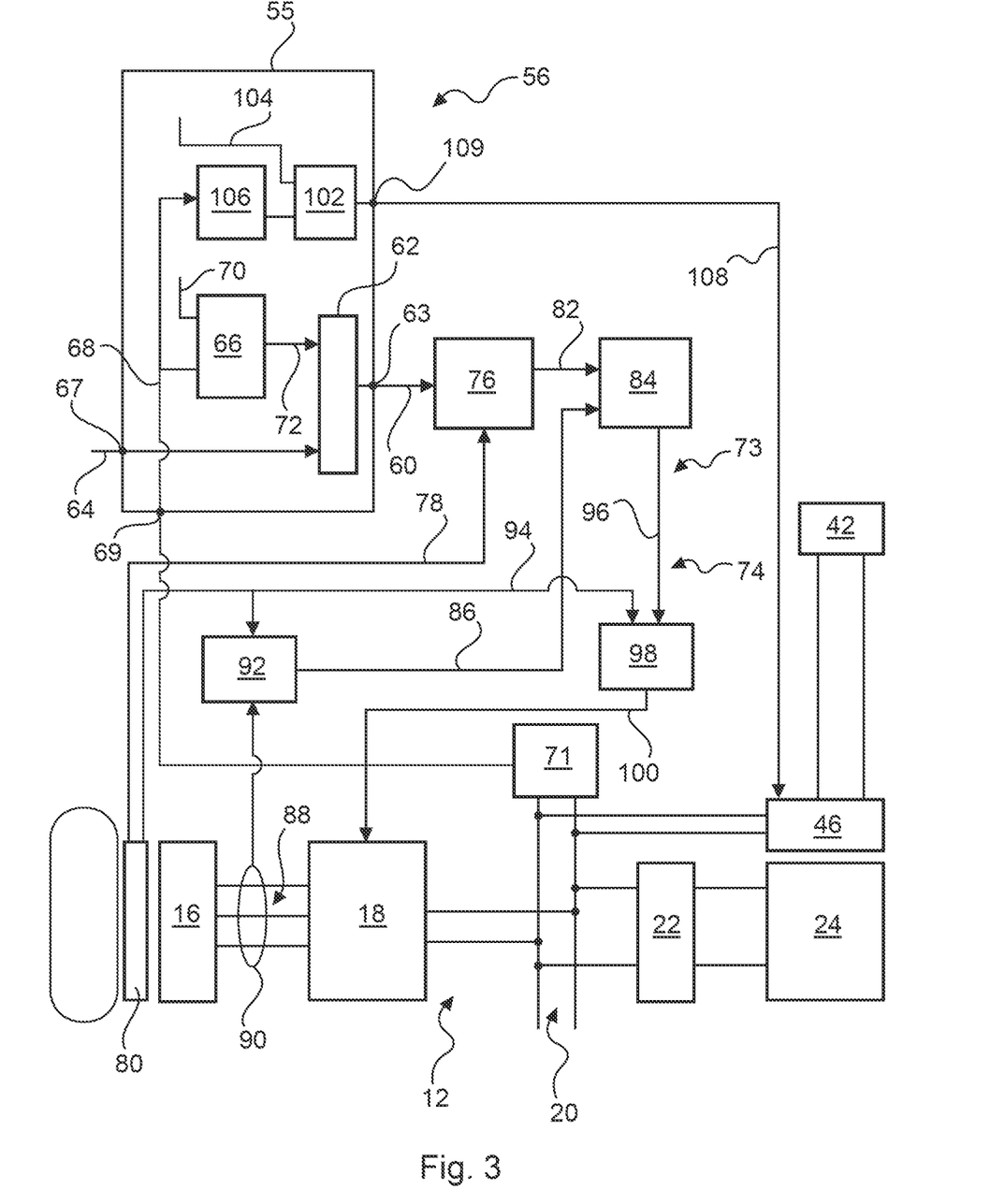
FIG. 3 shows the design of the driving of an electric drive in accordance with a further exemplary embodiment.

FIG. 3 shows substantially the elements from FIG. 2, wherein here, in addition, a second closed-loop controller unit 102 is arranged in the function block 55. The second closed-loop controller unit 102 is provided a further comparison value 104 as setpoint value. Furthermore, the second closed-loop controller unit 102 receives the voltage signal 68 as actual value, which, however, is derived via a differentiating element 106 prior to being supplied to the second closed-loop controller unit 102, in order to generate, depending on the change in this signal, a DC-DC converter drive signal 108 by means of the second closed-loop controller unit 102 as manipulated variable. The DC-DC converter drive signal 108 is output via a second output 109, then used to drive the DC-DC converter 46, which is connected to the high-voltage DC link 20 on one side and to a vehicle battery 42 on the other side.

Figure 4:
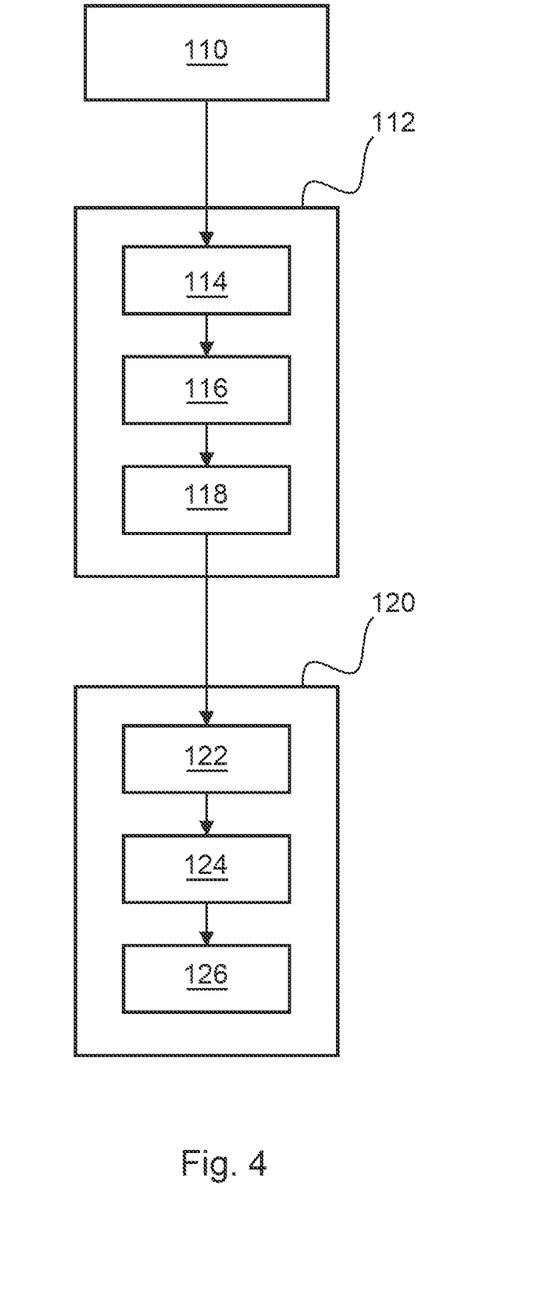
FIG. 4 shows steps in the method in accordance with one exemplary embodiment.

FIG. 4 shows the steps in a method in accordance with one exemplary embodiment. The method comprises a step 110, in which a voltage of a high-voltage DC link 20 is measured. In step 112, a converter drive signal 60 for an electric drive 12 is then generated depending on the voltage signal 68 generated from the measured voltage by a first closed-loop controller unit 66 depending on a predefined comparison value 70. For this purpose, step 112 comprises the subordinate step 114, in which the voltage signal 68 is supplied as actual value to the first closed-loop controller unit 66. In addition, in subordinate step 116, a predefined comparison value 70 is supplied as setpoint value to the first closed-loop controller 66. In the further subordinate step 118, a manipulated variable 72 of the first closed-loop controller unit 66 is output as converter drive signal 60. In a further step 120, a DC-DC converter drive signal 108 is generated by virtue of the voltage signal being supplied, in a subordinate step 122, to a second closed-loop controller unit 102. In a further subordinate step 124, a further predefined comparison value 104 is compared with the voltage signal. In a further step 126, which is subordinate to step 120, the DC-DC converter drive signal 108 is output.

The invention claimed is:

1. A control unit (56) for a vehicle (10) having an electric drive (12) and an electromechanically actuated brake unit (14), wherein the electric drive (12) includes a high-voltage DC link (20) disconnectably connected to a first energy store (24) of the electric drive (12), a converter (18) connected to the high-voltage DC link (20) and operable bidirectionally, and an electric drive motor (16) connected to the converter (18) for driving a wheel (50) of the vehicle (10), the electric motor being operable in a generator mode, wherein the electromechanically actuated brake unit (14) includes a brake drive circuit (36) connected to the high-voltage DC link (20), and an electric brake motor (34) connected to the brake drive circuit (36), for actuating a brake of the vehicle (10), wherein the control unit comprises a function block (55), which includes:
an input (69) for receiving a voltage signal (68) indicative of the voltage of the high-voltage DC link (20),
a first output (63) for outputting a converter drive signal (60) for driving the converter (18), and
a first closed-loop controller unit (66) for generating the converter drive signal (60) depending on the received voltage signal (68) and a predefined comparison value (70), in particular a setpoint voltage value.

2. The control unit (56) as claimed in claim 1, wherein the function block (55) additionally comprises:
- a second output (109) for outputting a DC-DC converter drive signal (108) for driving a DC-DC converter (46) connected between the high-voltage DC link (20) and a low-voltage DC link (48), and
- a second closed-loop controller unit (102) for generating the DC-DC converter drive signal (108) depending on the voltage signal (68) and on at least one of the comparison value (70) and a second comparison value (104).

3. The control unit (56) as claimed in claim 1, wherein the control unit (56) comprises a voltmeter (71) for measuring the voltage of the high-voltage DC link (20) to generate the voltage signal (68) therefrom and to supply the voltage signal (68) to the input (69) of the function block (55).

4. The control unit (56) as claimed in claim 1, wherein the control unit (56) comprises a changeover switch (62) for switching over between a normal operating mode and an emergency operating mode, and the changeover switch (62) is configured to generate the converter drive signal (60) in the emergency operating mode depending on the received voltage signal (68) and the predefined comparison value (70) and in the normal operating mode depending on a torque request signal (64) received at a second input (67), for the electric drive (12).

5. A system for a vehicle (10), the system comprising the control unit (56) as claimed in claim 1 and the electric drive (12), wherein the electric drive (12) includes:
- the high-voltage DC link (20) disconnectably connectable to the first energy store (24) of the electric drive (12),
- the converter (18) connected to the high-voltage DC link (20) and operable bidirectionally, and
- the electric drive motor (16) connected to the converter (18), for driving the wheel (50) of the vehicle (10), the electric motor being operable in the generator mode.

6. The system as claimed in claim 5, further comprising an electromechanically actuated brake unit (14) connected to the high-voltage DC link (20), wherein the electromechanically actuated brake unit (14) comprises:
- a brake drive circuit (36) connected to the high-voltage DC link (20), and
- an electric brake motor (34) connected to the brake drive circuit (36), for actuating a brake of the vehicle (10).

7. The system as claimed in claim 5, wherein the system comprises a first energy store (24) and a second energy store (42), wherein the first energy store (24) has a rated voltage corresponding at least to a multiple of a rated voltage of the second energy store (42), wherein the first energy store (24) is disconnectably connected to the high-voltage DC link (20), and the second energy store (42) is connected to a low-voltage DC link (48) or is part of the low-voltage DC link (48).

8. The system as claimed in claim 5, wherein the converter (18) of the electric drive (12) is a four-quadrant converter.

9. A vehicle (10) having a control unit (56) as claimed in claim 1, wherein the vehicle (10) is a utility vehicle, a heavy goods vehicle, a bus, a tractor, or a trailer.

10. A method for a vehicle (10) having an electric drive (12) and an electromechanically actuated brake unit (14), the method comprising the following steps:
- measuring (110) the voltage of a high-voltage DC link (20) of the electric drive (12) and transmitting a voltage signal (68) dependent on the voltage, to a control unit (56); and
- generating (112) a converter drive signal (60) for the electric drive (12) depending on the voltage signal (68) and a predefined comparison value (70) by a first closed-loop controller unit (66).

11. The method as claimed in claim 10, wherein the step of generating (112) the converter drive signal (60) (112) comprises:
- supplying (114) the voltage signal (68) of the high-voltage DC link (20) as an actual value to the first closed-loop controller unit (66),
- supplying (116) the predefined comparison value (70) as a setpoint value to the first closed-loop controller unit (66), and
- outputting (118) a manipulated variable (72) of the first closed-loop controller unit (66) as a converter drive signal (60).

12. The method as claimed in claim 10, wherein the method further comprises generating (120) a DC-DC converter drive signal (108), by performing the following steps:
- comparing (124) the voltage signal (68) with a threshold value or comparing a change over time with a change threshold value (104), and
- outputting (126) the DC-DC converter drive signal (108) only upon determining that the voltage signal (68) is below the threshold value or above a change threshold value.

13. The method as claimed in claim 10, further comprising the steps of:
- converting the converter drive signal (60) into a setpoint current variable (82) by a further closed-loop controller (76) depending on a present speed (78) of an electric drive motor (16),
- converting the setpoint current variable into a setpoint voltage (96) by a further closed-loop controller (84) depending on a current generated or taken up by the electric drive motor (16), and
- converting the setpoint voltage in a further unit (98) into a pulse-width-modulated signal (26, 100) for driving a converter (18).

14. A non-volatile computer memory storing a program code which causes on a control device of a vehicle (10) to initiate the following method steps:
- measuring (110) the voltage of a high-voltage DC link (20) of an electric drive (12) and transmitting a voltage signal (68) dependent on the voltage, to a control unit (56); and
- generating (112) a converter drive signal (60) for an electric drive (12) depending on the voltage signal (68) and a predefined comparison value (70) by a first closed-loop controller unit (66).

* * * * *